United States Patent [19]

Heichler

[11] Patent Number: 4,757,506
[45] Date of Patent: Jul. 12, 1988

[54] METHOD OF DECODING BINARY SIGNALS AND VITERBI DECODER AS WELL AS USES THEREFOR

[75] Inventor: Johannes Heichler, Murrhardt, Fed. Rep. of Germany

[73] Assignee: ANT Nachrichtentechnik GmbH, Backnang, Fed. Rep. of Germany

[21] Appl. No.: 1,866

[22] Filed: Jan. 9, 1987

[30] Foreign Application Priority Data

Jan. 15, 1986 [DE] Fed. Rep. of Germany ....... 3600905

[51] Int. Cl.$^4$ .............................................. G06F 11/10
[52] U.S. Cl. ......................................... 371/43; 371/37
[58] Field of Search ...................... 371/37, 43, 44, 45, 371/46

[56] References Cited

U.S. PATENT DOCUMENTS

| | | | |
|---|---|---|---|
| 4,240,156 | 12/1980 | Doland | 371/43 |
| 4,536,878 | 8/1985 | Rattlingourd | 371/37 |
| 4,606,027 | 8/1986 | Otani | 371/43 |
| 4,660,214 | 4/1987 | Pahlavan | 371/43 |
| 4,675,871 | 6/1987 | Gordon | 371/43 |

FOREIGN PATENT DOCUMENTS

| | | |
|---|---|---|
| 0052463 | 11/1980 | European Pat. Off. |
| 0054583 | 12/1980 | European Pat. Off. |
| 0127984 | 6/1983 | European Pat. Off. |
| 2477698 | 3/1980 | France |

OTHER PUBLICATIONS

IEEE Transactions on Communications, vol. COM-26, No. 10, Oct., 1978, pp. 1463-1470.
IEEE Transmactions on Communication Technology, vol. COM-19, No. 5, Oct., 1971, pp. 835-848.
NTC, vol. 3, 1981, E1.7.1.

Primary Examiner—Michael R. Fleming
Attorney, Agent, or Firm—Spencer & Frank

[57] ABSTRACT

A method and circuit for decoding binary signals processed according to an error correcting convolution code, in which the path metrics are transformed from the arithmetic into the logic range of operation. The path metric having the extreme value is subtracted from all other path metrics. All possible binary signal states occurring at the encoder are simulated in real time and are utilized to address hypothetical source data channels. From such a hypothetical source data channel fed by path decision bits, a buffer memory is actualized as well as the simulated binary signal states at the encoder. The output of decoded data from a buffer memory is effected in accordance with their addresses, namely for the extreme value of the path metric. For branching in the trellis diagram, the buffer memories whose associated trellis paths did not survive are overwritten.

4 Claims, 10 Drawing Sheets

| 2S | 2S+1 | EQA | Q(<8) | Q(≥8) |
|---|---|---|---|---|
| 0 | 1 | 0 | 0 | 1 |
| 1 | 0 | 0 | 1 | 0 |

| "New State" (ACS-S Nr.) | 0 | 1 | 2 | 3 | 4 | 5 | 6 | 7 | 8 | 9 | 10 | 11 | 12 | 13 | 14 | 15 | (even↔odd) |
|---|---|---|---|---|---|---|---|---|---|---|---|---|---|---|---|---|---|
| "Old State" ( BUS Nr.) | 0 | 8 | 1 | 9 | 2 | 10 | 3 | 11 | 4 | 12 | 5 | 13 | 6 | 14 | 7 | 15 | (<8↔≥8) |

| 2S | 2S+1 | EQA | Q(<8) | Q(≥8) |
|---|---|---|---|---|
| 0 | 0 | 1 | 0 | 1 |
| 1 | 1 | 1 | 1 | 0 |

FORCIBLY SWITCHED

| 2S | 2S+1 | EQA | Q(<8) | Q(≥8) | PSI(<8) | PSI(≥8) |
|---|---|---|---|---|---|---|
| 0 | 0 | 1 | 0 | 1_Z | 0 | 1 |
| 1 | 1 | 1 | 1 | 0_Z | 1 | 0 |

IDENTITY

METHOD OF DECODING BINARY SIGNALS AND VITERBI DECODER AS WELL AS USES THEREFOR

BACKGROUND OF THE INVENTION

The present invention relates to a method of decoding binary signals processed according to an error correcting convolution code, wherein binary operations form branch metrics and they again form path metrics according to the Viterbi decoding proces for the reception probability of the source data binary signals formed in the encoder.

This method and decoders operating according to this method are disclosed, for example, in IEEE Transactions on Communications, Vol. COM-26, No. 10, October, 1978, pages 1463–1470; IEEE Transactions on Communication Technology, Vol. COM-19, No. 5, October, 1971, pages 835–848; NTC, Vol. 3, 1981, E1.7-.1–E1.7.4; EP No. 127,984. A2; EP No. 52,463.A1; EP No. 54,583.

During the transmission of binary data signals, error correcting methods are often employed. One such method employs Viterbi coding at the transmitter and a corresponding Viterbi decoding at the receiver. Viterbi coding and decoding involves a so-called forward error correction, which means that no return receipt is required from the receiver to the transmitter. This is of advantage particularly for data transmission by means of satellites.

If the data source does not furnish inherent signals including natural redundancy, a correction criterion in the form of artificial time redundancy of the channel bits must be provided. Viterbi coding employs convolutional codes which derive time dependent information sequences from unique source signal processes. These information sequences are transmitted and correspondingly decoded at the receiver.

The decoders described in the above-mentioned publications are composed of networks including decision logics and calculating mechanisms for the determination of branch and path metrics according to the laws of Viterbi decoding, registers and memories for the intermediate storage of path metric information and output units for providing the decoded binary signals with the aid of decision criteria. A Viterbi decoder operating in VLSI (very large scale integrated) form is disclosed in NTC, Vol. 3, supra. In its ACS (add - compare - select) network for calculating the path metrics, many, specifically 27, gate planes, or logic levels, exist which lead to long signal delays.

SUMMARY OF THE INVENTION

It is an object of the present invention to provide a method of the above-mentioned type which processes a simple signal flow in the best, real time way. Other objects of the invention are a novel decoder and apparatus for a Viterbi decoder to calculate path metrics. This is accomplished with respect to the method by the following steps:

the path metric having an extreme value is transformed from an arithmetic form, e.g. a binary word, to a logic form, e.g. the position of a bit of one value in a series of opposite value bits;

the thus processed information is linked via logic gates with the other path metrics not having an extreme value and also subjected to such a transformation in such a manner that the path metric including the extreme value is subtracted from every one of the remaining path metrics;

all possible binary signal states occurring at the encoder are simulated in real time and are utilized to address a hypothetical source data channel fed by the data of the path decision;

from each hypothetical source data channel, all possible simulated binary signal states at the encoder are actualized simultaneously for addressing, as is a buffer memory;

in a branch of the trellis diagram of the Viterbi decoding process, the data of the buffer memories whose associated trellis paths do not survive are overwritten by the data from those buffer memories in which associated trellis paths do survive;

the decoded binary signals are put out by the respective buffer memories in accordance with the correct addresses by the possible binary signal states at the encoder or, more precisely, their actualization;

$2K-1$ different output instruction channels are addressed, where K=the constraint length of the convolution code, and only that channel performs an output instruction which is associated with the extreme value of the path metric.

The present invention has the following advantages.

The signal processing structure is very clear and thus can easily be cascaded in contrast to some of the above-mentioned possible prior art realizations. High speed signal processing is made possible. Signal processing occurs with very little delay.

A decoder and apparatus according to the invention also bring advantages with respect to their use in connection with known decoding processes, particularly as concerns signal delays.

The invention will now be described in greater detail with reference to the drawings.

DESCRIPTION OF THE PREFERRED EMBODIMENTS

Before actually describing the decoding method and circuits, several general relationships and terms of Viterbi coding/decoding will be explained for subsequent reference. Hereinafter, binary values will be enclosed in quotes, digital values will not.

Figure 1:
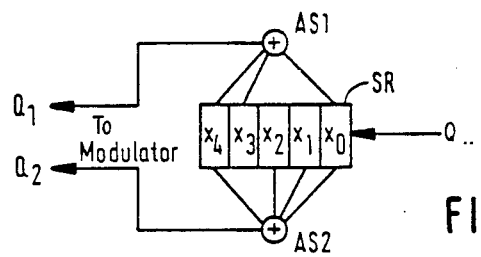
FIG. 1 illustrates the basics of a convolutional encoder.

Firstly, FIG. 1 is a schematic representation of a convolutional encoder. This encoder is composed of a shift register SR having a serial data input for its individual stages, or cells. Information, or source, bits Q are fed from the right into this register SR and are available in parallel for read out. In the illustrated example, the number of cells K=5, K being the "constraint length", which influences the type of convolutional code employed.

In the code described here, the parallel accessible data are linked together in two ways according to certain rules, the so-called "generator polynomials." This linkage is effected, in all convolutional codes by way of modulo-2 addition, illustrated schematically by the two modulo-2 adder stages AS1 and AS2, in the "Galois body" of binary numbers. This operation can be visualized as a parity check. If an even number of binary "1's" are added, the result is always a binary "0", while addition of odd-numbered of binary "1's" always results in a "1". The channel bits developed in the two adders AS1 and AS2 must be considered on this basis.

The remote receiver receives these channel bits mixed with all kinds of noise. Viterbi decoding now follows the basic idea of bringing the finite number of cells in the shift register into a relationship with the above-described modulo-2 coupling, and it utilizes the fact that a newly created bit pair (a dibit) is a function of prior happenings.

In the case illustrated here, the more or less interfered-with bit pairs reach the receiver by way of two parallel channels and often it is not clear, due to the existing noise, whether in the individual case it was a binary "0" or a "1" that was received. The voltage associated with each received bit may thus take on arbitrary intermediate values. This uncertainty is initially handled with the aid of the so-called "soft decision". It initially understands the received signals to be analog values which are quantized with the aid of A/D conversion in n levels. Here, quantizing in 8 levels is provided which corresponds to A/D conversion with 3 bits per channel. The signal portion associated with each received bit is thus individually quantized.

Since each original information bit has an associated bit pair in the channel, there exists the possibility, in principle, of four different bit combinations in one bit pair. Corresponding to these combinations, four calculating values are generated whose magnitude is a measure of the probability of a received two-bit combination.

If it is assumed that Q1 and Q2 are both quantized, 8-level signal values, i.e. each bit is quantized, then the four calculating values are composed as follows:

$R_{00} = Q1 + Q2$ $R_{01} = Q1 + 7 - Q2$ $R_{10} = 7 - Q1 + Q2$ $R_{11} = 7 - Q1 + 7 - Q2$

It can be seen that if an uninterfered with, or undegraded, dibit is unequivocally received, one of the four values (which are called "branch metrics") becomes zero, namely precisely that value which was indexed accordingly.

Let it be assumed, for example, that a dibit "01" was unequivocally received; then Q1="0", Q2="7" and correspondingly $R_{01} = 0$.

Of interest is here the behavior of the other three values:

$R_{00} = 7; R_{11} = 7; R_{10} = 14.$

It becomes clearly evident that in this case $R_{10}$ has taken on the character of an extreme value, while the equality of the other two correlates with the same (im)-probability.

Thus, with each received dibit, four calculation values from the soft decision stage are available and are a measure of the distance from the real received signal. In the case of a signal which has encountered interference, or is degraded, it is immediately very clear that it would not produce the "ideal" value of "0" and also in no way an "extreme" value "14", since the noise would produce additional voltage values at the input of the A/D converters.

The greater, for example, the noise, the more distinct appears the "mountain range" of these branch metrics; if there is only soft noise, they all lie at an average value.

Viterbi coding/decoding is now based on the further processing of these four calculation values in such a manner that it picks a longer information pattern composed of many dibits out of the noise by constantly summing the values and, after a sufficient number of summations, puts out a decision regarding the actual source information.

In this connection, it must be noted that the rule of the shift register applies here and, at the same time, the above-mentioned modulo-2 linkages exist (FIG. 1). The shift register rule, due to the number of cells, or stages, involved, naturally permits a number of stored bit combinations greater than the number of possible dibit combinations. In this connection, reference is again made to FIG. 1.

The content of the four (or generally K−1) lowest order bit stage defines the state of the register. The thus resulting binary word must be read as a binary coded number, with the lowest order bit being at that position, or stage, where the information bits are introduced, in FIG. 1 this being the right-hand stage. If, for example, a "0101"=5 is present in the four register state stages, then the introduction of a "0" makes it "1010"=10 and the introduction of a "1" produces "1011"=11. As can be seen, in the first case this operation corresponds to a multiplication of the value by 2 and in the second case to a multiplication by 2 and the addition of 1. In the same manner, as new information bits reach the register state window, stages $X_0$–$X_3$, each bit enters as the LSB, and disappears via the MSB—at the far left end. If, before input of a bit, a number greater than decimal 8 appeared in the window, a correct result after the bit input is obtained by subtracting this "8" before the input. As an example: if previously "1010"=10 appeared in the window, after the shift, "0101"=5 is obtained if a "1" is inputted. Thus in the course of the shift register process, ambiguities result which the receiver of course does not know and which it must exclude on the basis of its metric summation. This is where Viterbi decoding uses the received dibits to help.

Figure 2:
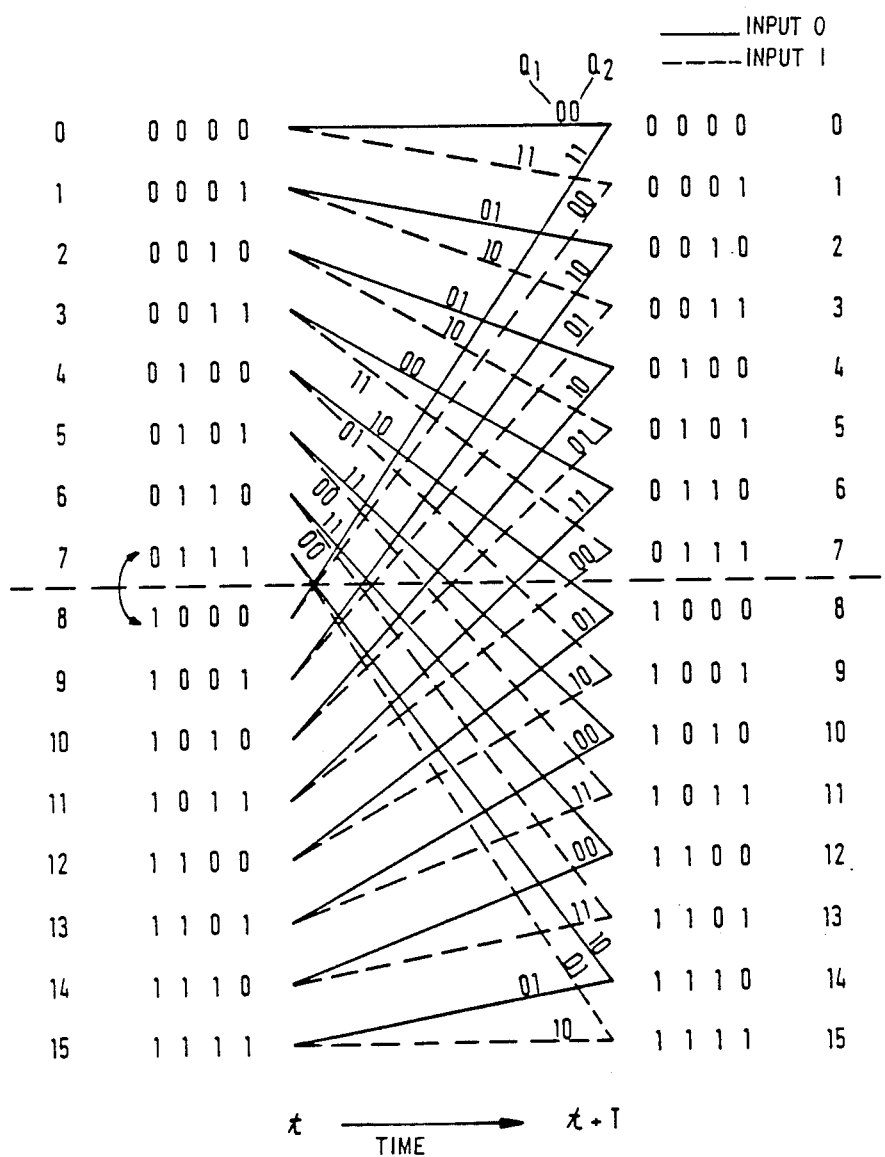
FIG. 2 is a trellis, or state transition diagram, illustrating permissible signal state transitions.

FIG. 2 illustrates the trellis, or state transition diagram often cited in applicable literature, which does not show anything other than the above-described shift register function for K=5 register stages. With the four-bit state definition window, there thus result sixteen possible register states which may exist before or after a bit input.

All possible register states are listed in digital and binary form along the left and right edges of FIG. 2. The left side is associated with the shift register state at a time t and the right side is associated with a shift register state at time t+T, T being the period between input bits. Between the listings there are lines designating permissible state transitions. Each solid line depicts the transition resulting from input of a binary "0", each broken line depicts the transition resulting from input of a binary "1". The horizontal broken line between digital values 7 and 8 represents a line of symmetry for all transition lines. On each transition line there is shown the dibit, $Q_1$, $Q_2$, resulting from that particular transition. They are indeed related only to the code employed, i.e. to the described modulo-2 linkage. There was no mention of them in the shift register function rule.

When considering the associations, it becomes evident that the dibit combinations are primarily uniformly equally distributed, i.e. each one of them appears only eight times on the total of 32 transition lines It is further notable that on the two lines branching from possible state value, the dibits have respectively opposite values. The associated calculating values of the branch metrics will thus be extremely, or maximally, opposite. If one were to consider all branches in every decoding step, a tree-like multiplication of the possible transitions would occur. In this connection it should be mentioned once more that, in principle, the Viterbi receiver does not know the starting state in the encoder of the transmitter and as a result must "assume" as many potential states of the shift register at the transmitter as possible.

However, the above-mentioned tree-like multiplication of states would always inevitably lead to exceeding the capacities at the receiver and, after a few steps, it would already be impossible to continue the decoding process.

This is where the likewise above-mentioned extreme difference character of the associated dibit code comes to the aid. As an example, it is assumed that there is a transition from a 0 to a 0 in the state window. As can be seen in the diagram of FIG. 2, the 0 at the time t+T may, however, also have been generated from the value of 8 at the time t.

However, the dibits generated by generator polynomials, and thus their branch metrics, exhibit extreme value characteristics. If, for example, in reality, the dibit "00" was received, the branch metric $R_{00}=0$—as already explained—while $R_{11}=14$. The apparatus is now able to conclude that the transition 0-0 must most likely have occurred, whereas the transition 8-0 can be excluded due to extreme improbability.

Such rules apply—as can be explained easily with reference to the diagram of FIG. 2, for every branch. This is also the reason why the selected code is not arbitrary but has optimum characteristics with respect to this mirror image characteristic. In this connection, it should be mentioned that here too there exist so-called catastrophic codes whose Viterbi decoding is unstable, i.e. in principle they emit the wrong source bits after some time. It is clear that a missing extreme value character, as described above, would result in more instability than the selected, optimum code.

This procedure of excluding improbable transistions, or branches, is an elemental component of Viterbi decoding; it is what makes possible its realization in practice. Thus, after every step or, as it is also called, in every trellis segment, 16 states result again from 16 states and the number of possible states always remains constant.

In the course of decoding, these 16 different states receive associated sum values which are composed of the branch metrics utilized during the decoding process. The exclusion of an improbable branch is also made, in principle, under consideration of the "past", i.e. the associated sum, and not possibly on the basis of the current extreme value branch metric alone. If, for example, the transition is again assumed to be 0-0, the sum of the preceding decisions is here, for example, assumed to be 10 for the old state of 0. The old state of 8 is assumed to have a sum of 5 in its past. Then it is again assumed that a real "00" dibit is received. The apparatus thus performs the following operation: the 0 sum, i.e. the sum for the prior state of 0, is taken and added to the branch metric $R_{00}$ which belongs strictly to this transition 0-0, as can be found in the diagram of FIG. 2, to form $S_0$. The sums for the "old states" are obtained similarly like the actual sums, for the whole process is a forward-flow process. The branch metric values contributing to a path metric calculation can easily be derived from the trellis diagram FIG. 2. Here, the "Q1, Q2" signing depicts the branch metrics used. E.G. the "new 6-sum" ($M_6(t+T)$) is composed by the $R00+M3(t)$, or alternatively, by $R11+M11(t)$. The smaller one is then selected. It is always a pair of branch metrics contributing to the calculation of a path metric.

Then the old 8 sum, i.e. 5 is utilized and is added to branch metric $R_{11}$ which likewise is strictly coupled with the 8-0 transition to form $S'_0$. The results are then:

$S_0 = 10+0 = 10 \; ;(R_{00}=0)$ $S'_0 = 5+14 = 19 \; ; (R_{11}=14)$

Then, the apparatus compares these two sums and selects the smaller one to be stored and to be used for the trellis decision. The larger sum is discarded. In this case, the transition 0-0 would be preferred and a 10 would be stored for the new 0 sum. Instead of the term "0 sum" ($S_0$), the term "path metric 0" or $M_0$, constituted by the smaller of the two sums will be employed hereinafter, which is also an accepted definition of this term in literature.

In connection with the summing and decision making processes, the following should be considered: the selection of the "surviving" branch depends to an extreme degree on the path metric, i.e. the already summed values, so that, in comparison thereto, the current branch metric can step into the background. In the above example the "$R_{00}$" was relevant because of the small subtotals or prior sums. In the course of a long summing procedure, however, the reverse may easily occur: a path metric will become so large that the apparatus will always exclude it as "worse", regardless of how large the current R is. On the other hand, if there is a long period of reception without interference, a minimum path metric is formed so that a temporary excess in the current branch metric is caught. The result is that The path metric always has a greater weight than the current branch metric; it constitutes a preferred minimum sum of numerous "good" branch metrics of the past, i.e. of an entire "path".

This is where the capability of the Viterbi coding/decoding process lies; it utilizes the artificial channel redundancy and corrects occurring transmission errors.

So far, only the mechanism has been discussed which selects the most probable one of the shift register function transitions. It must now be discussed how ultimately the transmitted informtion bit is obtained. As explained above, different path metrics belong to 16 different shift register states newly generated in each step, with the "value peaks" of these path metrics constituting a rather precise measure of the most probable shift register process at the transmitter. It has also become clear that in the procedures employed here great probabilities go along with minimum values of the metrics.

It is thus the object to select from the 16 path metrics the one having a minimum value and to trace the associated trellis process back to its starting point at which the summation started. The information bit pushed into the shift register at that time can be decoded, i.e. put out as probable. This completes the Viterbi decoding for one time step.

The next sequence is analogous: the actualized path metrics are again utilized for addition and comparison which is the reason that this process is also called ACS (add-compare-select) in the literature. ("Select" for the then following selection of the smallest value metric.)

An exemplary decoder will now be described to explain the individual process steps. The individual component groups of the decoder are presented in the sequence of the flow of information.

Figure 3:
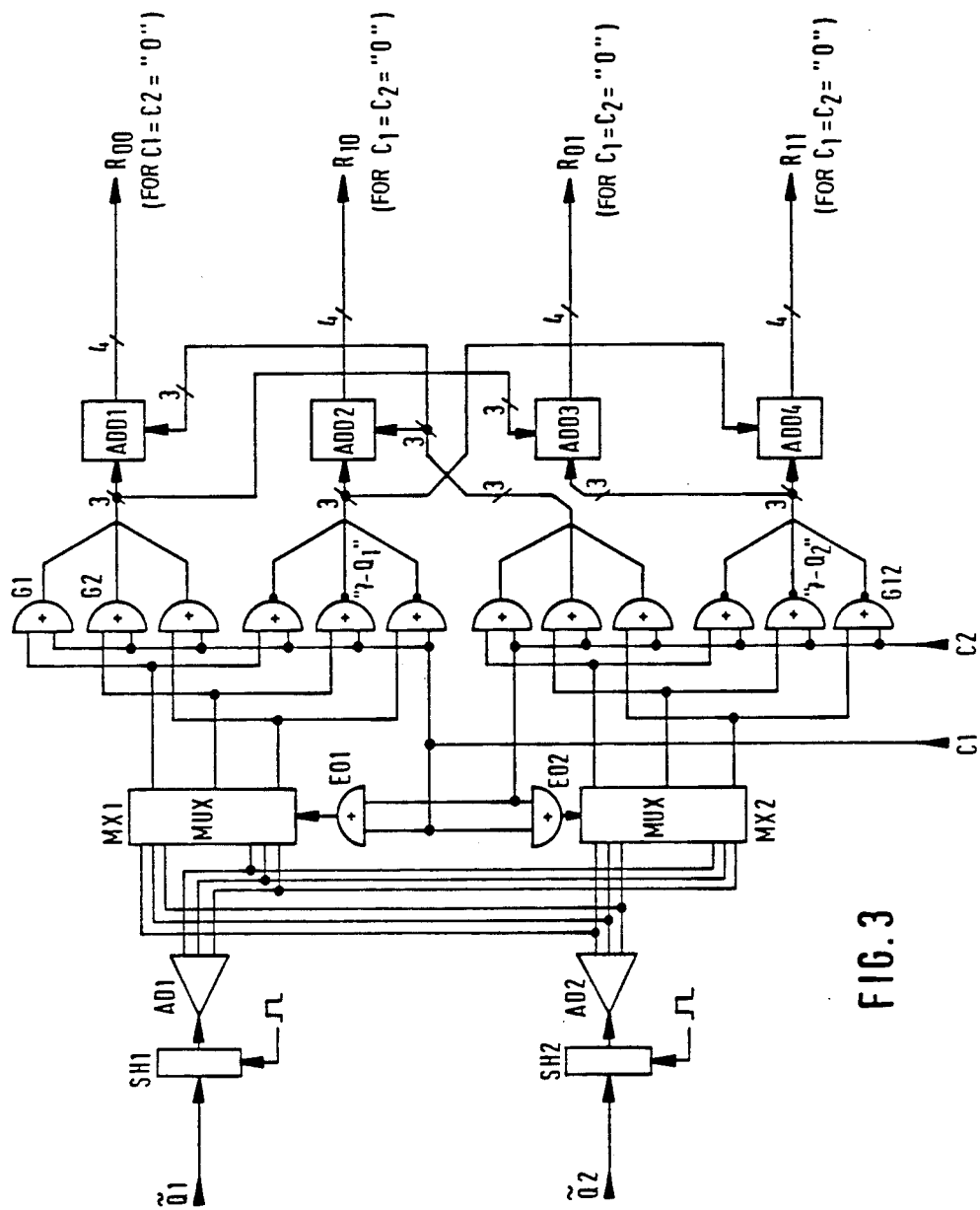
FIG. 3 is a block diagram of the input section of a decoder according to the invention.

The input section of the Viterbi decoder is shown in FIG. 3. This input section serves the purpose of making the known soft decision (as described, for example, in EP No. 52,463.A1) with the aid of A/D converters and with switching of the quantized dibits for synchronization purposes. The input signals Q1 and Q2, which are transmitted over the transmission path in parallel, first reach two clock pulse controlled sample and hold members SH1 and SH2. These sample and hold members are each followed by an A/D converter AD1 and AD2, respectively, each having a three parallel bit output. Consequently, in the illustrated embodiment, quantizing involves 8 levels.

For the case of a shift in carrier phase during 4-PSK transmission, the revaluation of the bits must be cancelled. But this does not involve only compensation of the occurring inversion of a bit in the case of a ±90° phase shift, but also the then occurring exchange. Therefore, the channels downstream of A/D converters AD1 and AD2 are made crosswise interchangeable with the aid of multiplexers MX1 and MX2. A simple logic system then permits the realization of the transformation rule of coordinate rotation.

| Example: | | +90° phase shift |
|---|---|---|
| Exchange: | $\sin(\beta) \rightarrow \cos(\beta)$ | corresponding to Q1 → Q2 |
| | $\cos(\beta) \rightarrow -\sin(\beta)$ | corresponding to Q2 → −Q1 |
| | | −90° phase shift |
| Exchange: | $\sin(\beta) \rightarrow -\cos(\beta)$ | corresponding to Q1 → Q2 |
| | $\cos(\beta) \rightarrow \sin(\beta)$ | corresponding to Q2 → Q1 |
| | | 180° phase shift |
| | inversion only, no exchange. | |

The two multiplexers MX1 and MX2 are each controlled, by way of a respective Exclusive-OR member E01 or E02 by control signals C1 and C2. These control signals can be derived in a simple manner from the synchronizing apparatus. The synchronizing apparatus (not shown here) detect the rise in the metric, i.e. the occurrence of impermissible codes and phase shifts. The 3-bit wide outputs of each multiplexer MX 1 and 2 are each brought, corresponding to the number of quantizing levels, to a respective one of Exclusive-OR gates G1, G2, G3 and G7, G8, G9, respectively, and a respective one of Exclusive-NOR gates G3, G4, G5 and G10, G11, G12, respectively. Gates G1 . . . G12 are monitored by way of their control inputs which receive control signals C1 and C2. Control signals C1 and C2 cause those of gates G1 and G12 which are configured as inverters, to function as non-inverters, and vice versa. To the right of G1–G12, each conductor is associated with a numeral indicating the number of parallel lines present in the actual circuit.

This configuration realizes two effects simultaneously with little delay: the quantized values Q1 and Q2 are each available once non-inverted and once inverted, with the inversion being controlled with the aid of control signals C1 and C2. On the other hand, this inversion actuates in the most simple manner the calculation operation "7-Qi" since it forms exactly the unit complement of the values Qi. This inversion eliminates one calculation operation. The thus processed information need now only be fed to four full adders ADD1 . . . ADD4, with the linkages having to be effected according to the already presented relationships for the branch metrics $R_{00}$, $R_{01}$, $R_{10}$, $R_{11}$.

Figure 4:
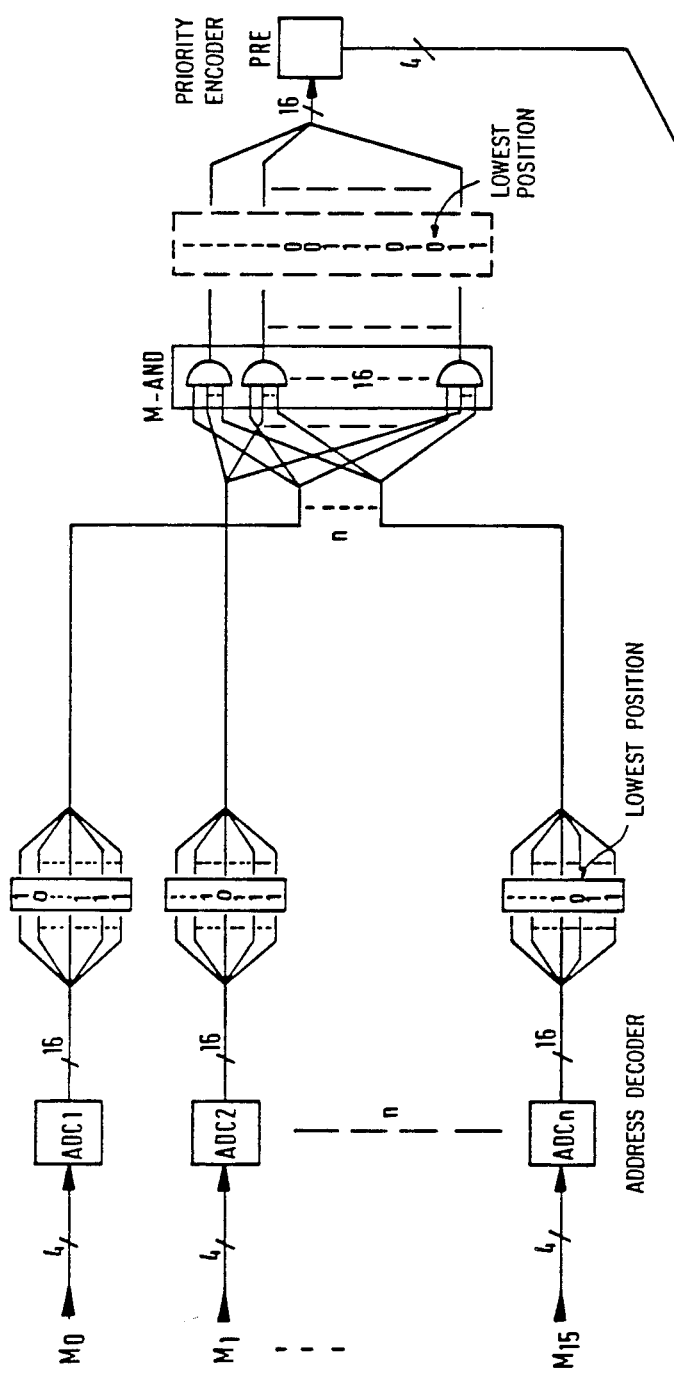
FIG. 4 is a diagram showing the construction principle of networks for the quick determination of the smallest path metric.

The outputs of the input section are connected with networks for adding and comparing the metrics. The assembly principle of such networks is shown in FIG. 4. Addition and comparison are effected by means of transformation of the calculation operations from the arithmetic to the logic range of operation, which is equivalent to a strict parallelization. The ACS process (add - compare - select) can thus be performed at high speed. Fast address decoders and multiplexers as well as fast priority encoders permit the display of a binary number as a logic state ("0" or "1") at a particular position in a row of $2^n$ bits. If one operates in the range of logic binary operations against such a background, it becomes clear that addition becomes possible by shifting the $2^n$ bits and the smallest number of a quantity of numbers can be found by parallel AND and OR linkage, respectively, of the thus transformed numbers. The choice is free here between a positive and a negative logic.

FIG. 4 shows the principle of the method. Initially the step of "comparing" is carried out as follows: with the aid of address decoders ADC1 . . . ADCn, a plurality of, for example, four bit wide binary numbers of metrics M0 . . . M15 are initially represented, at the outputs of the decoders, as bit positions. This may be, for example, one logic "0" at a certain position among 15 logic "1"'s. Then each one of the 16 bit arrays is fed to a multi-AND gate M-AND, where all bits are linked, bit-by-bit, corresponding to the AND function. The result is again a 16 bit array which has collected all logic "0" states and their positions. A connected priority encoder PRE provides the position of the LOWEST "0" as a binary number. However, this corresponds on the other hand to the lowest binary number at the input of the corresponding address decoder ADC1 . . . ADCn.

Priority encoders of this type can be assembled of standard components, e.g. of two 74F148 IC's. The interconnection for a 16-line-to-4-line binary encoder of two of such standard components is disclosed in the TTL Data Book, Supplement to CC-401, 2nd Edition, Texas Instruments, page 293, or in the FAST-DATA Book. The comparing operation takes place at two significantly different locations within the Viterbi decoding process, namely initially during the branch selection in the trellis segment and finally during detection of the minimum metric of the 16 paths shortly before output of the decoded bits. Since prior attempts at a solution appeared to be very complicated (e.g. they employ a whole "tree" of arithmetic comparators and encountered a corresponding number of delay problems), the realization of the present invention results in advantages, particularly because of its uniform structure and its VLSI compatibility.

The "adding" operation in the logic plane depicted in FIG. 4 requires special modules having a width of 16 bits. This process is of interest with respect to VLSI integration, particularly with a view toward the "barrel" shift matrix technology. Such components are required by the adder since it must be able, at high speed, i.e. asynchronously and without flip-flops, to shift a 16-bit word by a maximum of 16 bits as instructed by a 4-bit binary number In the ECL technology, such a component operating with 8 bit processing can also be employed.

Figure 5:
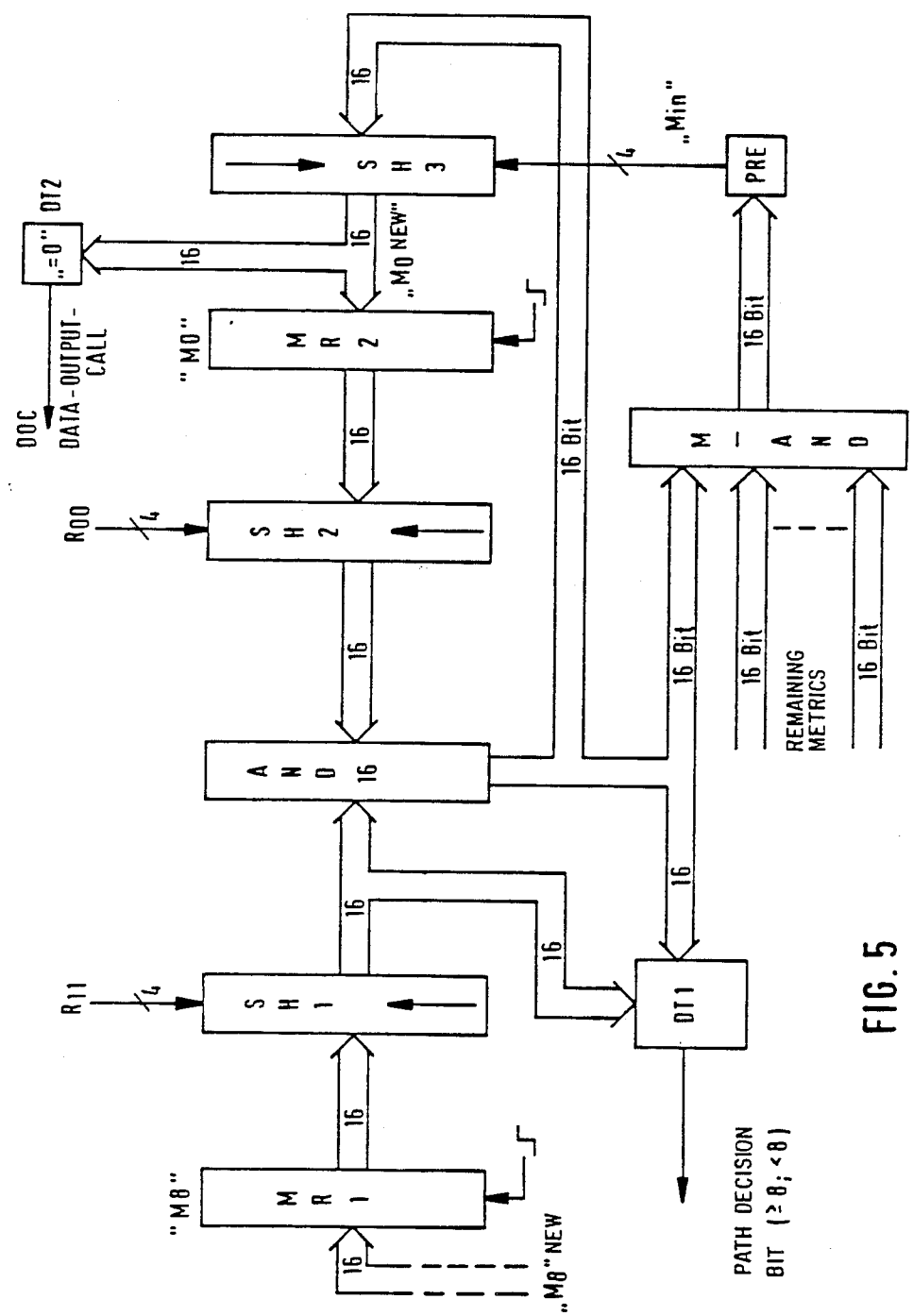
FIG. 5 is a diagram of the principle of metric evaluation with the use of barrel shift matrixes.

The "barrel shift adding method" will now be explained with reference to FIG. 5. It constitutes a shorter signal flow path in the ACS network and thus has less delay than a half-arithmetic realization. FIG. 5 illustrates the principle of metric evaluation utilizing 16-bit shift matrixes. The above-described circuit for locating the minimum metric is already incorporated. Again the example of a trellis branch transition 0-0 and its alternative 8-0 is utilized. The branch metrics $R_{00}$ and $R_{11}$ originating from the input section are simultaneously available at the top of two 16-bit shift matrixes SH1, SH2, each receiving a 16-bit array from a respective register MR1 or MR2 of the same width. Registers MR1 and MR2 here function as logically transformed metric registers.

Shift matrixes are gate-arrays without and Flip-Flop characterists involved. Nevertheless, they perform operations similar to shift registers, i.e. the shift of a binary pattern. The immense important difference to shift registers is that this operation is performed asynchronously, i.e. without any clock being necessary, i.e. with maximum speed. Shifting a pattern several places is as fast as shifting it only one place. With these properties, the following input-output features can be defined:

| SHIFT MATRIXES | | SHIFT REGISTERS | |
|---|---|---|---|
| INPUTS | OUTPUTS | INPUTS | OUTPUTS |
| Bit Pattern, e.g. 16 Bit Control: binary number, | Shifted Pattern, 16 Bit | Parallel Load inputs Control: n clocks for shifting n places | Parallel outputs |
| 4 Bit <—> 16 Places Asnchronous network (gate array) | | | |

For further information about the circuitry structure, refer to e.g. FAIRCHILD, F100 Series, e.g. the 100158 element, which is an 8 Bit wide shifting matrix.

In this codec implementation, 16 (and, for the decision Bit derivation, 32) Bit shift matrixes are necessary. This width really does not exist on the standard element market, and a cascadation of smaller elements goes with increasing hardware expense. So it is obvious, that the best way to create fast shift matrixes for the Viterbi algorithm is a VLSI integration.

The metric "M0" originating from the right-hand register MR2 is thus shifted in shift matrix SH2 by precisely $R_{00}$ positions and is fed to the 16-fold AND element AND16, i.e. each bit from matrix SH2 being supplied to a respective binary AND gate of AND16. The same is done with the metric "M8" from the left register MR1 only that now $R_{11}$ causes the shift in position.

To understand, where the "new" and "old" metrics stem from, becomes very easy when regarding the trellis diagram, FIG. 2: (Really, this is the ACS-S connection rule!).

The so-called ACS Procedure exactly must go along with the trellis structure:
The "old" metrics are sums linked to the left file of states (time "t"), i.e. the state number is the name of the sum (and so it is a hardware REGISTER place!).
The "new" metrics are sums linked to the right file of states (time "t+T"), i.e. the same registers mentioned above are updated with the new sums computed by the ACS-S network.

To give an example, let's take the "M8 new": The trellis diagram shows, that state "8" could have had its origin in state "4" with the received dibit combination "10" and that means: with the branch metric "$R_{10}$" or, alternatively, in state "12" with the dibit combination "01" and that means: with the branch metric "$R_{01}$". The ACS-S network now creates two corresponding, alternative sums and selects the smaller one.

Let's now regard FIG. 5 again: It shows the circuitry for computing the "M0 new", which is derived from the register contents "M0" itself and "M8". You can see that "M0 new" is restored in "MR2" in the right half of the drawing. Quite analogically, this is done with "M8", i.e. there exists a COMPLETE CIRCUITRY like in the FIG. 5 to compute "M8 new", which is stored in "MR1" in FIG. 5 (FIG. 4 is only a basic circuit to demonstrate the transformation into the logic plane, FIG. 5 operates totally there). The only difference is, that "M8" can't take its orign from itself like "M0", because this is forbidden by the trellis rules. If we regard again the FIG. 2 and look at the "M0" origin branches we see, that "M0" can stem from itself or from "M8". So we have found the "trellis twin" corresponding to FIG. 5. As a result it can be seen, where the origins of each "M(0–15) new" are located. A structural singularity newly occurs at the "M15" processor, where "M15" also is taken from itself. So the "edges" of the trellis are somewhat extraordinary, because an only-zero-sequence and an only-one-sequence, shifted into the encoder shift register, are quite similar: The state does not change!

Also from the trellis diagram it can be estimated, that it takes 16 ACS-S processors like FIG. 5 to compute all "M(0-15)" values in real time and that the interconnection between these processors is really not a trivia problem when layouting a hardware realization. Additionally it can be seen from FIG. 5, that each "M(0-15)" is a metric reduced by the minimum of all: The output of PRE serves every (back-) shift matrix preconnected to every register "M(0-15)". (Also "M8 new" stems, at the end, from a "SH3-Type"). It is not drawn here). This prevents an overflow during the addition process.

The AND function actuation (stage AND16) has bee described above in connection with the selection of the minimum metric. The position of the logic "0" is here initially collected.

The resulting 16-bit array is now fed to two further stages. Firstly, to the known multi-AND stage M-AND for determination of the minimum metric and, on the other hand, to a further shift matrix SH3 at the input of metric register MR2, which now, however, serves the purpose of shifting the bit pattern back by a certain amount. As can easily be seen from the circuit, it is precisely the amount of the minimum metric, detected by a priority encoder PRE, which causes the return shift.

The circuit shown in FIG. 5 is, except for M-AND and encoder PRE, one of 16 identical circuits each associated with a respective one of the 16 path metrics $M_0$–$M_{15}$. The output of encoder PRE is supplied to each of those circuits.

Arithmetically speaking this means: the minimum metric is subtracted from each metric to prevent overflow of the memories. Thus the minimum metric is subtracted down to zero in each step, and the other metrics are smaller than before precisely by the amount of the minimum metric. It must be noted that in this circuit this all takes place asynchronously, i.e. without intermediate clock pulse steps, and thus with an extremely short delay. Only the new storage in the registers must occur with a clock pulse flank, which is a matter of course for memory elements. Since the network presented here connects the ACS operation in one step with the minimum subtraction, it will be called the ACS-S (add—compare—select—subtract) calculating mechanism.

The ACS calculating mechanism of the Viterbi decoder developed here is consequently characterized in its mode of operation primarily by the fact that the arithmetic operations of "adding" and "subtracting" are replaced by logic shifting operations, with neutral characters being added—depending on the sign of the logic—at the shift-in location. Moreover, the mechanism is characterized in that the determination of an extreme value (in the illustrated example, the minimum) is effected in the logic range by simple AND and OR linkages—depending on the sign of the logic.

The derivation of the information for trellis memory management (decision regarding change of state, output information) and the output apparatus are merely a circuitry question. It must here be detected whether the metric from the "left" or the "right" register and its addition, see FIG. 5, has "survived" and from where this minimum metric originates, i.e. in which register it had ultimately been filed. The former would have to be done in a position comparator, the latter by "zero" detection in the registers. However, these procedures will not here be specified, particularly since they are highly dependent on available components.

The ACS-S network in principle furnishes two intersection items of information defined as follows as outputs in the direction toward trellis management:

1. The path decision bit which has a logic "1" for a past state that was greater than or equal to 8 (corresponding to a "0" for states less than 8).

2. The data output call bit which has a "1" for an output from the corresponding trellis memory.

It is understood of course that these signs are in no way obligatory but must be understood as examples. Depending on the available modules, a positive or negative logic may become necessary.

For the case of a constraint length of 5 (5 stages in the decoder at the transmitter) described here, there is a total of 16 ACS-S networks, each providing a respective path decision bit and data output call bit, which must subsequently be processed further in the trellis memory management.

For the purpose of putting out a phase decision bit, a path decision bit detector DT1 is provided which evaluates the input and output data of the AND16 stage. A data output call bit is put out by minimum metric detector DT2 which is supplied with the data in the return loop between shift matrix SH3 and register MR2.

The detectors DT1 and DT2 consist of quite simple circuitry: DT1 contains at the 16-bit-sides two priority encoders like PRE transforming the patterns into the arithmetic plane. The result are two four-bit-wide numbers. Then, a four-bit comparator follows, known e.g. as 'LS85 or 'S85, indicating, whether the two numbers are equal or not. If equality is indicated, this is an information about the origin of the selected smaller metric (because there only remains one alternative!). This is the path decision bit. For higher resolution of the decision, a width of 32 bit in the logic plane resp. 5 bit in the arithmetic plane may be implemented.

DT2 consists of a priority encoder, too, transforming into the arithmetic operations range, followed by a simple "zerro" detection (e.g. the "OR" function of all four bits!) indicating the minimum metric (the "best") naturally occuring after the subtraction of the (same) minimum metric. To understand the function of a priority encoder (e.g. the 'LS148 or 'F148), refer to FIG. 4 or standard Data Sheets.

Figure 6:
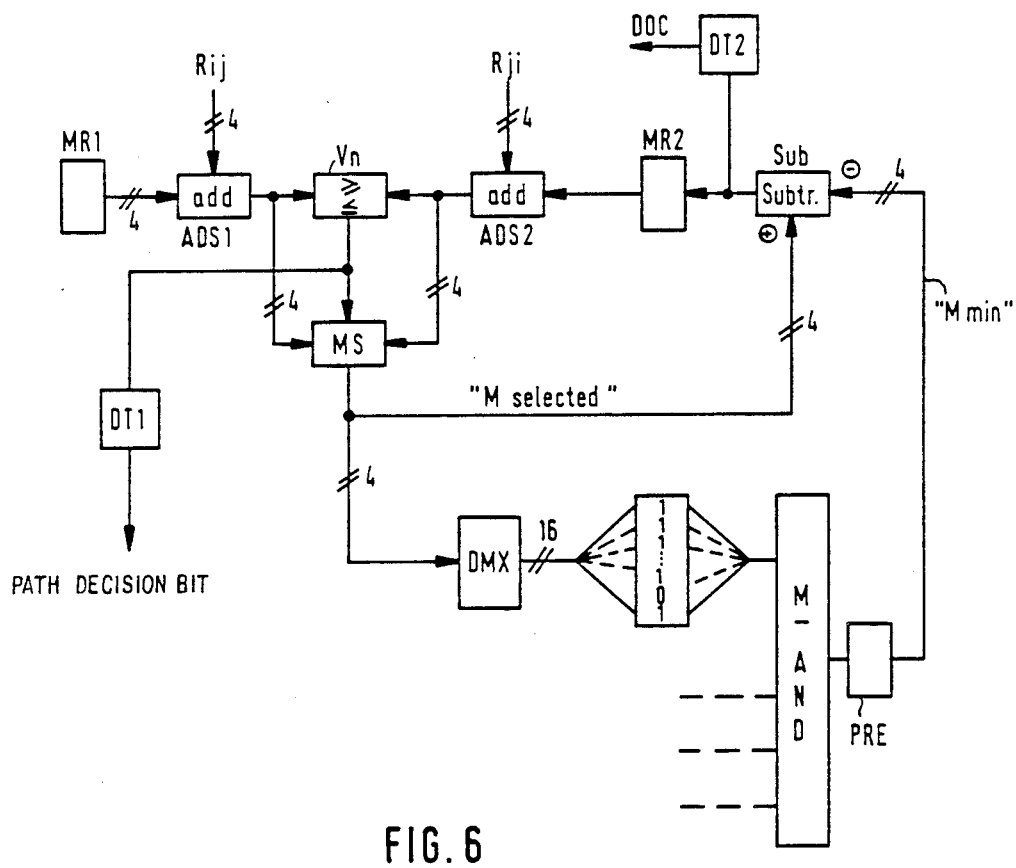
FIG. 6 is a diagram showing the principle of metric evaluation in a semi-arithmetic embodiment.

Another configuration of the ACS-S networks is shown in FIG. 6. There, such a network is half-arithmetic, i.e. the operations "add" and "compare" are performed by means of arithmetic adders and comparison stages. Only the linkage via the multi-AND stage M-AND takes place in the logic operating range. In this structure, information processing is not as fast as in the embodiment according to FIG. 5, but more easily available standard modules can be employed.

The opposite branch metrics Rij and Rji are each fed to a respective adder stage ADS1 or ADS2. The 4-bit wide outputs of these adder stages are connected with the two inputs of a comparison stage Vn and with the two inputs of a metric selector MS. Comparison stage Vn determines which one of the two opposite branch metrics is the greater one or whether there is equality. Its output controls metric selector MS.

The output of metric selector MS is connected, via a demultiplexer DMX, with one set of inputs of multi-AND stage M-AND. The demultiplexer converts the arithmetic operation to a logic operation, i.e. it makes available a 16-bit wide word which represents the metric as a bit position on one of the 16 demultiplexer output lines. The 16 outputs of demultiplexer DMX, like the outputs of all of the AC-S networks, are connected with the multi-AND stage M-AND. The minimum metric is available by way of priority encoder PRE at the output of the M-AND stage, and is subtracted in subtraction stage Sub from the selected path metric "M selected". As in the embodiment of FIG. 5, subtraction stag Sub feeds metric register MR2 and minimum metric detector DT2.

The memory administration itself will now be discussed. The technique of trellis or path memory management is not satisfactorily applied in the prior art embodiments. This is true, in particular, with respect to increasing constraint lengths (greater than 3), in which the expenditures for signal flow of the information traffic between memory cells very quickly takes on an unmanageable volume.

A structural determination of the path memory also substantially fixes the structure of the entire Viterbi decoder concept. This is also the reason why it will be discussed here first. Numerous further processes, such as, for example, addressing and data supply, are derived from the path memory structure as is the procedure which hereinafter appears by the term "sample process method" and which essentially relates to a very fast addressing method.

As already mentioned, Viterbi decoding is primarily a signal flow intensive method. Memory space per se is less of a problem. The reason is mainly the fact that delayed decoding with a delayed decision is necessary for the output of the source information. Moreover, there is the tree-like character of the "trellis diagram" which, with increasing number of lines in the decoder, exhibits a rapidly increasing variety of states. The nature of the information to be stored there determines the degree of complication of the path memory structure.

In principle, there exist two types of path memory. The first type is used to store branch decisions, i.e. data about whether a new state resolved from an old state which—taking our example of K=5—was greater than or equal to 8 or whether it was created from such a state without occupying the MSB (most significant bit), i.e. was less than 8. It is quite clear that in such a process, the information regarding the actual state is lost and can be recovered only via the detour of a "trace back" to the actual start. If one disregards possible losses due to delay during this process, there still remains a relatively complicated signal flow system between the memory cells and this increases with increasing constraint length. The consequences are not only a relatively large amount of hardware but also greatly increasing signal unreliability associated with difficulties in checking the system. Due to these and other imponderables, such a system realization was abandoned very soon.

The second type of path memory, used in the decoder according to the invention, is characterized by the storage of source bit sequences and appears to be quite attractive because in this embodiment the decoded information is directly available at the output and need only be picked up there according to the minimum metric. However, a drawback which should not be underestimated in this method is its real time unfriendliness. The reason for this is simply that a new shift register state is equal, in only the rarest cases, to its predecessor.

If one looks at the diagram of FIG. 2, it becomes clear that this could happen at most in two cases, namely for a 0—0 transition or a 15—15 transition, i.e. if the shift register has its minimum or maximum occupancy. If one thus associates a fixed state with the currently introduced bit, the concept of K=5 adhered to here results in a multitude of 16 different memory rows in which the information from the past of this state is recorded in addition to the above-mentioned information bits. Since, however, each new state also grows out of a quite different "information chain" (a trellis path), each stage would not only have to be actualized with a new head but would also have to be exchanged for a completely different stage so that at the end the association is again correct. Since these connections are very important for the specification as well, an example will again be given.

Let it be assumed hereinafter that the state 0 exists and resulted from an 8-0 transition. These are possible transitions as can easily be seen in FIG. 2. Then, consequently, the entire information sequence of the 0 except for the head bit would have to be replaced by the information sequence of the 8. The sequence of the 8 itself would have to make way for the 4. But this must in no case be done by overwriting the 8 sequence would no longer be available to create the 0 sequence, etc.

If the sequence of the 8 is overwritten, it is no longer available to overwrite another memory content and so on. This method would imply double buffering.

It can be seen that two buffers would have to be provided for the entire memory space so as not to lose any information during the procedure. Moreover, the frequent changes of memory would use up a lot of processing time so that this method is not usable for fast decoders. However, this method of information storing is extremely advantageous because of its clarity of arrangement and the absence of the complicated "trace back" procedure. It was therefore desirable to connect the advantage of information storage (clear arrangement, ease of access) with the advantage of decision storage (greater real time capabilities).

Figure 7:
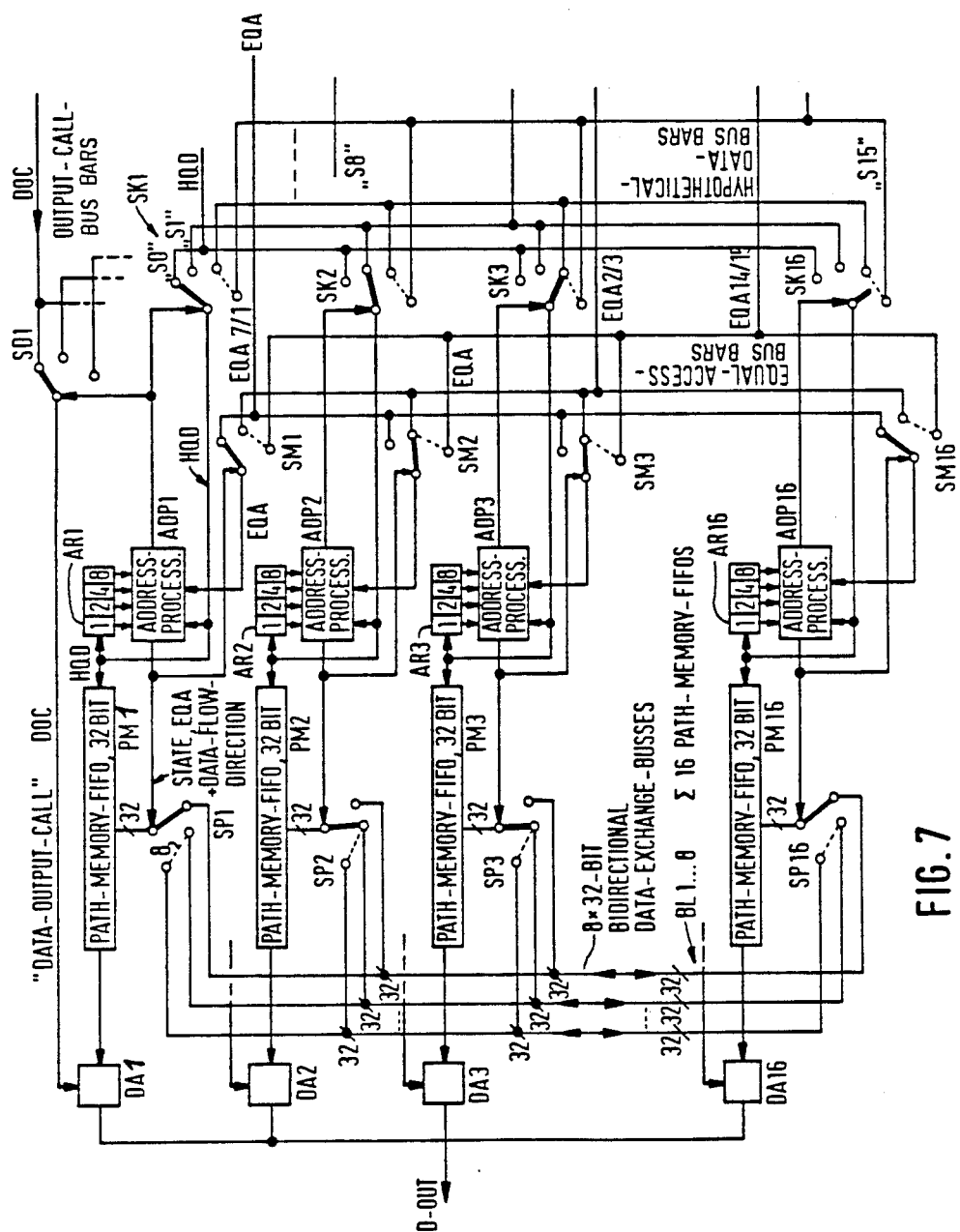
FIG. 7 is a diagram showing the principle of path memory actuation.

FIG. 7 shows the principle of path memory actuation. The term "sample process method" employed hereinafter is based on the fact that the possible states at the encoder in this process are a real time simulation in every step and serve to address the path memory rows. This is done with the aid of the "sample process shift registers" —address registers AR1 . . . AR16—and address processors ADP1 . . . ADP 16, which control various multiplexers, here shown as selector switches SK1 . . . SK15 and address switches SD1–SD15. Of the latter switches, only switch SD1 is shown, but each channel is associated with an SD switch. For various signals, each switch SK switches a data channel corresponding to the address of the sample process to buffer memories PM1 . . . PM16, hereinafter called path memories.

Let us first consider the signal HQD (hypothetical source, or information, data):

It directly represents the stream of the information sequence which feeds, on the one hand, the head of path memories PM1 . . . PM16 and, on the other hand, of course the sample process, i.e. address registers AR1 . . . AR16 with current data. In this connection, reference should briefly be made to the basic idea of this method. Above it was mentioned that the path memory rows must be restored constantly if the "head" of the rows is associated with fixed states. Here the head address is variable in principle; it changes in the rhythm of the statistically dependent sample processes controlled by the receiver which eliminates the need for later restorage since the data reach their correct place immediately (in-place computation).

Moreover, each path memory row is now designed as a FIFO (first in - first out) memory so that the still remaining restorage of one bit in each row can be effected with the aid of a single clock pulse. The complicated "trace back" process has been reduced to this operation. The term "FIFO" is in no way fixed here. It may refer to an elastic memory in which the data put in at the front immediately "drop" down to the end of the line, or a fast, cascadable shift register may be employed, which will be the case here since the elastic memories at present still take too long to pass through. The "HQD" bit really is not the decision bit, but it is derived from it. More precisely: The small circuit of FIG. 12 performs the transformation of the decision bits into the "HQD" bits. Another result of this interfacing is the "EQA" bit indicating that the outputs of two ACS-S circuits are equal. (EQual Access). This is necessary for path memory management. The circuit is described below.

Next, let us consider the signal DOC (data output call):

Each one of the 16 path memory rows is associated with such a signal. This signal is likewise supplied via address switches SD1 . . . SD16, which are each controlled by one of the address processors ADP1 . . . ADP16. Once the minimum metric has been determined, the (stationary) ACS-S1 . . . ACS-S16 calculating mechanisms emit an "alarm signal" at the corresponding location to cause a source bit to be put out from the preferred memory section. To assure that this call reaches the proper location, the path must go via "exchange switches" SD1 . . . SD16.

In summary, the mode of operation of the path memory can be described by stating that information sequences are stored linearly, i.e. according to a FIFO procedure and "trace back" is realized by only a 1-bit shift. This is possible only because addressing, i.e. the addresses of the memory rows, are not stationary but are derived from $_2k-1$ sample processes which take place upstream of the memory rows and are fed with source bit data from the corresponding ACSS network. Moreover, the emission of a decoded source bit is characterized by the fact that it likewise occurs through the intermediary of sample process addressing.

However, the above does not completely describe the "sample process method". The realization of Viterbi decoding also requires the consideration of a special case which may occur during the course of decoding.

This is the case of branching in the trellis as it was described indirectly in the discussion of the diagram of FIG. 2. According to the special case, one of the 16 path metrics has become so low compared to the others that two new states are calculated simultaneously from a single, old state—not considering the extreme value character of the branch metrics. The result is of course that the old twin state, which is always associated in pairs (symmetry line in this example betweem 7 and 8) together with its attached path of prior states, is discarded. Thus, decoding gets rid of a whole path memory row which can then be considered to be available. This availability for new information is absolutely necessary if one considers that a full 16 new states must be processed through in every time step. If thus two new states are calculated from one old state, actually both would have to be written over (1) the state of the surviving old sample process and (2) the contents of the head bit of the surviving path memory row. Since this is not possible—we have here a so-called "equal access process" (so defined here and called "EQA" hereinafter)—the entire contents of the surviving path memory branch must be written over the contents of the discarded branch before the head bit is made current. The result at the end of this process is consequently a new pair of memory rows whose contents is identical except for the head bit. The latter is inevitably different since the two new states are even and odd.

The realization of this EQA process is very decisively determined by how often it is necessary per time step, i.e. in the performance of the entire Viterbi decoding process. In principle, two realizations are possible: a sequential and a parallel realization.

After in depth examinations it has been found that the EQA process, on the average, occurs approximately three times per received dibit, with, however, "overheads" of up to fully eight EQA's occurring per time step during start-up processes (start of the decoder, sudden changes in the amount of interference). Thus, the sequential solution had to be discarded because it would have to be able to perform, in the extreme case, eight pair formations successively in time, with only a time of 100 ns being available for an entire time step.

The parallel solution is also offered in FIG. 7. With 16 newly produced states, a formation of a maximum of eight pairs is possible. The instruction to form pairs is represented by the EQA signal. According to the sample process method, this signal is also addressed via multiplex switches SM1 . . . SM16 which, in this case, however, require only eight positions. Then it is evaluated in the respective address processor. The result of this evaluation is again the positioning of other exchange switches SP1 . . . SP16. These are each shown below the path memory rows. All bits in each FIFO arrangement PM are accessible in parallel and are available to one of the exchange switches SP1 . . . SP16. Then it is possible to connect each bit of the path memory in a pair with any corresponding bit of another FIFO and according to the EQA information, with the direction of data flow and signals determining such direction being discussed below.

Thus, in this solution there exist, taken together, eight different data buses BL1 . . . BL8 over which every two path memory rows can exchange all of their data. The connection of these buses is again determined by the associated sample process and the EQA information as well as by a signal to determine the direction of data flow. It will be seen later that the latter signal can be derived from the hypothetical source data.

In summary, the mode of operation of the path memory can be characterized by the fact that branching in the trellis process coincides with pair formation of two information sequences. This pair formation is characterized by the fact that all bits of a non-surviving sequence are overwritten by the associated, surviving sequence. Such a process is called EQA, meaning "equal access". For high speed applications, the realization is characterized by the fact that EQA is effected on $2^{K-2}$ parallel addressable data buses BL1 . . . BL8, with K being the constraint length of the encoder. Addressing of data buses BL1 . . . BL8 is likewise effected with the aid of the sample processes.

The Elements "DA1-16" are output devices controlled by the DOC signal and may be imagined in this circuit diagram as e.g. tristate drivers being enabled when the DOC signal becomes active. "D-OUT" is the decoded data stream then: the decoding process is completed.

The "ADP1–16" devices shall indicate the control of the multiplexer switches "SM1–16" and are together with them normally components of one multiplexer chip. To draw the diagram more visibly they are concentrated in one block here and control all switches together. Generally it can be said: The sample process shift registers AR1–16 control by their parallel output bits THE ADDRESSES OF three groups of multiplexers, called "SM1–16", "SD1–16" and "SK1–16".

Nevertheless, the switches, or more precisely, the switch groups, are controlled slightly different: The "SM1–16" and the "SD1–16" participate of all four state bits, for there are entities of 16 signals each to compute: 16×HQD and 16×DOC. The EQA—switches ("SM1–16") operate without the MSB of the 4-bit state word, because EQA occurs at maximum 8 times on the corresponding bus bars, for it indicates the parallel data exchange of path memory FIFO pairs. The MSB of the state decides whether the state is greater, equal or smaller than 8. So it is sufficient, depending on the trellis rules, to perform the correct in-place-computation of the EQA information using the three lower bits of the state, addressing only 8 bus bars. An example may be given with the state "8" having had its origin in "4" or "12": The sample process shift registers contain at a moment to the "old states" 4 and 12, located somewhere in the circuitry. Discarding the MSB, that means, the "4" remains the "4" and the "12" becomes the $12-8=$"4", too. So the "old state" locations "4" and "12" are now predestinated to perform the parallel data exchange, for their bus bar addresses are now equal! It is easy to realize, that, with the truncated state, there exist exactly eight of such pairs at each time $t+nT$, where T is the shift register clock period. Similar considerations can be made concerning the data exchange bus switches "SP1–16". Each of them selects one of eight data exchange busses being the parallel communication link between two path memory FIFO's. Again, the MSB is discarded to select a pair depending on the trellis rules.

So the sequential steps of the process are:

| Time: | Transaction: |
|---|---|
| t = to | "old states" standing by, HQD and EQA bits setting up through the multiplexer groupt, being addressed correctly. Parallel FIFO data setting up on the exchange busses. |
| t = to + T/2 | Parallel clock flank performs parallel FIFO data exchange in the path memory. |
| t = to + T | Serial update of the FIFO's (serial shift-in). Each bit changes its position and the last one appears at the serial output (the DA1–16 modules). With parallel timing to this, the sample process registers "AR1–16" are serially updated. Consequently, all switches change their position depending on their new addresses. The DOC signals now find their way correctly by the updated multiplexer paths. |

Here we see, that an additional clock flank is necessary for the parallel shift transaction at to+T/2.

The signal flow intensity of the path memory becomes particularly evident at this point, not the least due to the presence of eight different data exchange buses over the entire width and length of the memory. If the realization is structured to also be logically quite simple and clear, it still requires a lot of space. The number of bidirectional bus drivers required exceeds by far the amount of memory (FIFO) hardware so that it is of advantage to integrate the entire path memory section. This section would form a unit on a chip similar to the long available RAM or EPROM chips, particularly since the technology of Viterbi decoders will presumable find broader uses. Therefore, the possibility of VLSI integration should expressly be pointed out here.

Another aspect is the already briefly mentioned serial solution for the EQA.

For not-high-speed applications (less than 5 Mbit/sec), serial processing of the EQA processes would be available since it is much more economical in the use of space. For example, no bidirectional bus drivers are required since shift registers equipped with bidirectional data channels are already available and the bus exchange is no longer needed. Its place is now taken by a priority count which merely decides which memory pair is the next one to exchange data.

An alternative realization for the path memory is characterized in that the EQA data exchange takes place on one data bus for each pair of memory rows consecutively in time and the time prioritization required for this purpose is likewise derived from the sample processes.

Figure 8:
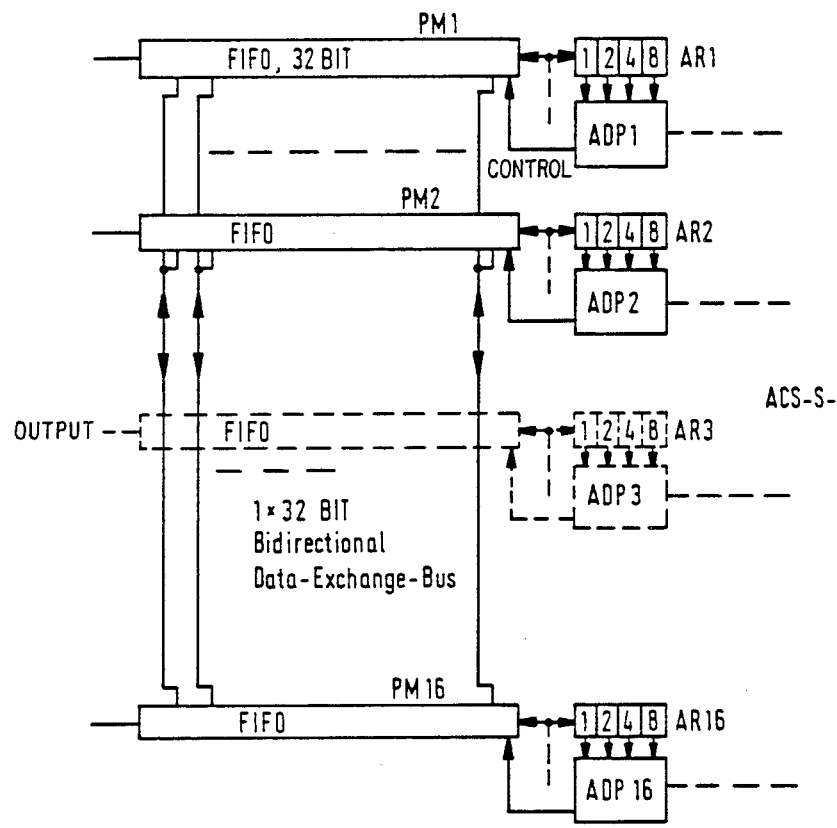
FIG. 8 is a diagram showing an alternative principle of data exchange in branches of a trellis diagram.

FIG. 8 illustrates this principle which likewise has considerable advantages for VLSI integration, particularly because of the gain of speed then offered. Both versions of path memory can be fully cascaded. Their outputs can be connected with the inputs of further units, while the control signals, such as EQA, etc. are carried along in parallel. This emphasizes the flexibility of such a system, e.g. with respect to the use of so-called "punctual codes" for which a multiple of the path memory length must be switched in.

The interface between the already described components "ACS-S network" and "path memory" produces no complications from purely an engineering aspect. However, particularly because of this fact, it constitutes a particularity as far as logic units are concerned. Not only the hypothetical source data but also the important information elements for equal access are derived from it. In particular, the information regarding the direction of data flow in such a case—which memory overwrites which—has not been discussed at all.

The data output call bit is not modified at all in this interface stage. It is coupled conductively directly to multiplex switches SK1 . . . SK16 of the respective address processors ADP1 . . . ADP16.

The "path decision bit" as the output signal of an ACS-S network is provided 16 times corresponding to the 16 ACS-S units and, corresponding to its logic state, indicates whether the current new state was derived from the same old state which was less than 8 or from a state of the quantity "greater than or equal to 8". Thus, this bit indicates the position of the old state above or below the symmetry line of FIG. 2.

However, this output signal in no way coincides with what is required at the input of the path memory: a statement regarding the new state; namely whether it is even or odd, or in other words: whether the new hypothetical information data bit is to be based on a "0" or a "1".

As can be seen, this problem is solved very easily, if certain marginal conditions are observed. Let it be assumed that a logic "1" represents a path greater than or equal to 8, and a "0" correspondingly the opposite.

Figures 9, 10, 11, 12, 14:
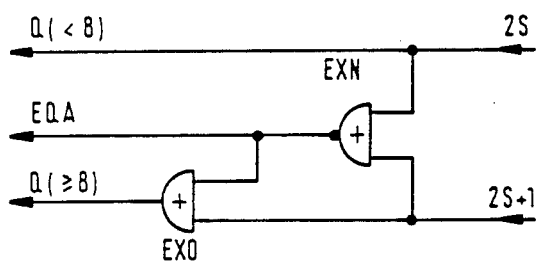
FIG. 9 is a truth table for recoding a decision signal.
FIG. 10 is a diagram showing the connection scheme between ACS-5 networks and address processors.
FIG. 11 is a diagram of a connection scheme for the special cases of branches in a trellis diagram.
FIG. 12 is a diagram of a circuit for enforced switching.
FIG. 14 is a truth table for the data flow direction signal in a branch of the trellis diagram.

Then the truth table of FIG. 9, which shows the recoding of the decision signal, can be set up for the case that no EQA appears.

In this table, "2S" indicates a newly created even state ("even") and "2S+1" a new odd state ("odd"). Correspondingly "Q(8)" is the hypothetical information bit that is to reach the old address "less than 8", "Q($\geq$8)", however, is the information bit with the target of "greater than or equal to 8". Then the truth table must be interpreted as follows. The ACS network "2S" which belongs to an even state, makes its decision which means "the past is less than 8" (logic "0"). Thus a "0" would have to be written in at address Q(<8).

This is noted in the table of FIG. 9.

Since it was further assumed that no EQA was to be present, the ACS-S network "2S+1" correspondingly puts out the inverse information: "1" with "past greater than or equal to 8". The requirement is now to write a "1" into address "Q($\geq$8)". In summary, odd states always produce a logic "1", even states a logic "0". This is what is required, because if a "1" is put into the encoder shift register, an odd state results, of course. The reverse applies for the "0".

In the ACS-S networks existing here which are associated with stationary states, caution is necessary, however. They emit logic states with other meanings than "even" and "odd". In the above example, the data bit "0" accidentally coincided with output bit "2S" and "2S+1", respectively.

In the second line of the table, the reverse is noted. Now the "even" ACS-S network "2S" puts out a "1" which means "past greater than 8". The table shows the required source bit in column "Q($\geq$8)", a logic "0" (=even, new state). It is the reverse for ACSS network "2S+1". It puts out a "0" with the desire of writing a "1" into the address "less than 8", according to its parity. The table and the above statements lead to the simple consequence: as long as there is no equal access, it is sufficient to connect ACS-S networks associated with even states with addresses "less than 8" and networks associated with odd states with addresses "greater than or equal to 8". That in the second case described above, network "2S" put out a "1" and, correspondingly, network "2S+1" a "0" is in no way objectionable since, due to the alternativity of the two outputs, the networks put out the correct states substituting for one another.

The symbols "2S" and "2S+1" are names of even or odd ACS-S decision bit outputs. (See also FIG. 13 outputs of "ACS-S 1–16" connected to "IF1–16"). In the description of the ACS-S unit we said, that each ACS-S network corresponds to a state, for it calculates the path metrics linked with this state. The naming "2S" or "2S+1" wants to express the new-state-property, if "S" means the "old state": "2S" is the name of an even "new state", "2S+1" the name of an odd one! On the other hand, "Q(<8)" and "Q($\geq$8)" are the names (=addresses) of the so-called HQD bus bars. From the description above we know, that each bar corresponds with a multiplexer input addressed by the state in the sample process shift registers "AR1–16". So an "address", mentioned above, means a certain bus bar, connected to the identical inputs of all multiplexers, i.e. inputs with identical addresses!

Thus, recoding here is constituted only of a change in meaning under consideration of the marginal condition that no EQA is assumed to exist.

FIG. 10 shows the connecting scheme resulting therefrom between the ACS-S networks and the address processors. With respect to the output of the ACS-S network, the term "equal access" means that an even as well as an odd unit claim the same past, i.e. emit the same logic states.

If, for example, "2S" as well as "2S+1" emit a "0", this means that both want to output to address "less than 8" at the same time and again according to their respective parity, i.e. "2S" a "0" and "2S+1" a "1".

The FIG. 10 is a pure hardware connection scheme under the condition of absence of EQA. We can refer to FIG. 9: "2S" and "2S+1" correspond to the first line of FIG. 10: The even and odd "new states". On the other hand, the second line in FIG. 10 contains the bus bar addresses "Q(<8) resp "Q($\geq$8)" . The simplest example may be given by the connection of the "1"—ACS-S output to the "8"-bus bar. If not EQA occurs, a simple wire would be sufficient between these devices. Refer to FIG. 9: If "2S", that means e.g. ACS-S No. 0, outputs a "0", "Q(<8)", that means bus bar No. 0, receives this, and at the same time (no EQA!), the output of "2S+1", that means ACS-S NO. 1, reaches correctly its destination in "Q($\geq$8)", that means bus bar No. 8.

These considerations are equivalent to those for all the other connections. But simple connections like these are no longer sufficient when EQA really occurs!

FIG. 11 shows the two special cases for an EQA state in the system. The table according to FIG. 10 should here initially continue to be used as a connection list. It is notable that the EQA signal is now "1" and thus defines such a state. In the first line, the above mentioned example is listed: two calculating mechanisms put out the same state, with the output of "2S" (a "0") again being suitable. It reaches the address "less than 8" directly. However, the output of "2S+1" is wrong here. Pursuant to the requirements, its meaning must be changed. Although it still had the meaning of a "pointer" when it left the ACS-S network, it must now be forced to switch on the basis of the meaning of a "data bit", which is noted in the truth table. Now the output is correct again in this case: a data "0" from ACS-S network "2S" again reaches the address "less than 8" and the output of unit "2S+1" also reaches its correct destination: Q($\geq$8) is now "1".

Now the second special EQA case will be considered in the second line of FIG. 11. Both calculating mechanisms put out a "1" with the intention of writing into addresses "greater than or equal to 8", again pursuant to their parities.

Let it here be assumed that again the bit reaching "Q(<8)" remains unchanged, the bit reaching "Q($\geq$8)", however, is forcibly switched. Then the data information written in this way is again correct: a "1" goes to address "Q(<8)" (meaning: "coming from the "2S+1" network"). It must be considered, of course, as in the first case, that a path memory information row is duplicated: bit "Q($\geq$8)" will again be the opposite, thus here a "0".

Thus, the above described operations assure that the sample processes as well as the memory always receive the correct information bit representations and a change in meaning is made for the information coming from the ACS-S units. The "branching" in the trellis is here simulated by forced switching of the respective bits. Thus even with equal access, two completely new, different sample process states are always created, namely one even and one odd state as well as two identical path memory rows having different head bits. This logically somewhat complicated procedure is realized with the aid of eight very simple circuit configurations which are shown in FIG. 12.

The Exclusive-NOR linkage EXN generates the EQA signal for equal output states, and forced switching is actuated by the Exclusive-OR element EXO. As described, only the "odd numbered" channels are switched. The short-delay character of the circuit becomes evident.

In summary, the interface of the ACS networks for supplying the path memory address processor with data can be characterized in that data having path decision character are converted to data having information character in the sense of the hypothetical source information. The processor is further characterized in that this is effected by recoding the information content "greater than or equal to $2^{K-2}$" and "less than $2^{K-2}$" to the information content "odd" and "even", the association of the meaning as well as the sign of the logic, however, not being fixed.

K is here assumed to be the constraint length. For the case of equal access (branching in the trellis) the interface is characterized in that the respective bit of a parity is forcibly switched to then make available in parallel the information content "even" and "odd". Finally, the interface is further characterized by the fact that it makes available an equal access signal as described above precisely $2^{K-2}$ times, which indicates the equality of the output signals of two ACS-S networks with association to the even and odd state.

Figure 13:
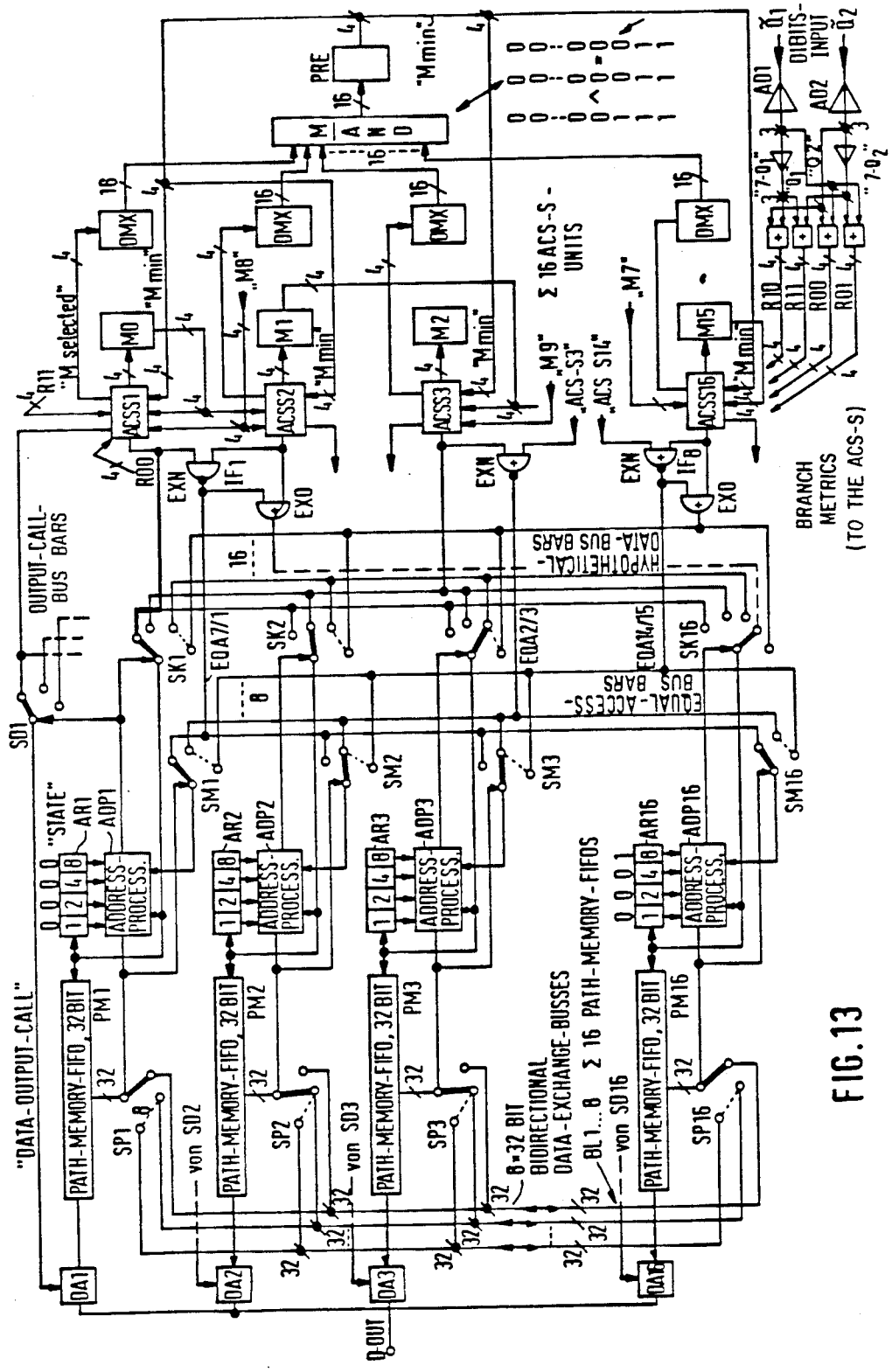
FIG. 13 is a circuit diagram of a complete decoder circuit according to the invention.

A complete circuit is shown in FIG. 13. If the preceding statements related primarily to method details, attention will now be directed toward the total signal processing procedure. The already discussed components and method features will not be discussed again.

One exception is the data flow direction signal for equal access which ultimately can be described only in connection with the total system and has therefore not been discussed before.

The right half of FIG. 13 shows the input section and the ACS-S networks which have already been described in detail. The connection between the two blocks is made by the 4×4 bit lines which can be seen at the bottom right and which are marked "$R_{00} \ldots R_{11}$". This is the data stream of the branch metrics, which is synchronous with the stream of the received dibits. It must be noted that, pursuant to the trellis rule and corresponding to the code, only two of the four-bit bundles are connected with an ACSS network, namely the above-mentioned opposite branch metrics. However, as already explained, all metrics find an equally distributed connection within the entire ACSS complex. For the sake of clarity this is not shown completely, but the inputs to ACSS1 are shown by way of example. An embodiment of ACSS1 is shown in FIG. 5.

After the described metric calculations have taken place—which occurs asynchronously, i.e. at the maximum possible speed—no writing back into metric actualizing registers M0 . . . M15 described in connection with FIGS. 5 and 6 takes place as yet because the output information from the ACSS network must still be available. Only after this information has been intermediately stored within the ACSS network, is the metric register actualized.

After the interface modification, also described above, the hypothetical information bit data HQD, the EQA signal and the data output call signal DOC, as shown in FIG. 7, reach the respective bus bars and from there the multiplexers SK, SM and SD, respectively, which are actuated by the sample process states.

As long as the old states are still present, the EQA procedure and the actualization of the path memory continue. Only then do the sample processes also change their states and thus the multiplex switches change their position pursuant to the metric calculation. Now the data output call takes place and thus the output of a decoded information bit by data output units DA1 . . . DA16.

To increase the speed of the process, it is advantageous to clock the calculating results of decoupled processes with the aid of intermediate memories so that decoding is delayed by a few steps but thus takes place faster. These decoupled processes are:

1. sample and hold conversion in A/D converters AD1, AD2 and branch metric calculation;
2. add—compare—select—subtract in the ACSS networks;
3. actualization of the metric registers;
4. EQA procedure;
5. actualization of sample process and path memory as well as data output.

Some of these processes can be run in parallel so that five clock pulse steps are not necessarily required. The information for data flow direction will now be discussed which must be available if there is an EQA case and a path memory row is to be overwritten.

The circuit diagram of FIG. 13 shows primarily that no additional signal is provided for this purpose, which signal would also have to be carried over separate multiplexers and bus bars.

In fact, this information is already contained in the combination of hypothetical source data and EQA signal, and it should be considered that the hypothetical source data information originally had the meaning of a path decision, which has been described in detail.

Thus, considerable circuit expenditures can be saved if a few simple relationships are considered, as represented in the truth table according to FIG. 14. FIG. 14 gives the data flow direction signal with EQA (branching in the trellis).

FIG. 14 shows only the case where an EQA state exists. Only then does data exchange become necessary between the memory cells. Then, as shall be repeated briefly, there exist two different configurations:

1. both ACSS output signals are "0" (pointer at address "less than 8"), as shown in the first line of FIG. 14;
2. both ACSS output signals are "1" (pointer at address "greater than or equal to 8"), as shown in the second line of FIG. 14.

Both cases can be seen in the table of FIG. 14. Let us first look at case 1. Since originally both pointers pointed at an address "less than 8", the associated sample process and the path memory row have obviously been preferred. That means that these data are not overwritten in any case but that they are intended to overwrite the data belonging to the address "greater than or equal to 8". If therefore a logic "1" is defined as an "overwrite instruction" at the location of the associated address, then the information has arrived correctly, as shown by the table of FIG. 14. The forcibly switched bit at "$Q(\geq 8)$" simultaneously serves as a parallel shift instruction.

Let us now look at case 2. Both pointers demand an address "greater than or equal to 8". Now, conversely, the data of the memory cell with the address "less than 8" must be overwritten. As can be seen, the hypothetical source data bit "Q(8)" can again serve as an instruction for this which this time is not the forcibly switched bit but the "direct" bit.

The reason for this identity is the following:

The ACSS output signals constitute original pointers. They therefore are a concrete indication of which address is to be preferred. The ambiguity created by the equal access is removed by the forcible switching. Thus a logic as well as a local criterion can be derived for the direction of data flow.

FIG. 14 wants to show that the in-place-computed hypothetical source data generally are able to serve additionally as a parallel shift instruction. The broken line arrows indicate that there is an identity between a supposed shift information and the "Q"-bits, or more precisely: That the shift instruction can be directly derived from them. We know, that "Q($\geq 8$)" and "Q($<8$)" define certain even and odd state bus bars. By the multiplexer switches SK1-16 the informations are in-place-computed (FIG. 13) and are now available at the corresponding address processors ADP1-16 and the path memory lines PM1-16 linked to them. So, if e.g. both ACS-S networks "2S" and "2S+1" output a logic "0", it is certain, that, per definition, the "Q($<8$)"-address has been preferred to dominate. The opposite address "Q($\geq 8$)" has to be overwritten, concerning the path memory line. The circuit FIG. 12 now provides a forcible switching of the "Q($<8$)"-bit to restaurate the even <-> odd ambiguity for the path memory head bit and the sample process states, like it has been described. Of course, this forcible switched bit is also in-place-computed together with the non forcible-switched one. At their place, they define now:

(I)

The source data updates for the sample process state and the path memory line head bit,
(A) even,
(B) odd.

(II)

(A) A PSI ($<8$) (=Parallel Shift In) instruction if the state here is $<8$ (shift or shift not).
(B) A PSI($\geq 8$) shift instruction if the state here is $>8$ (shift or shift not).

Please note, that after the in-place-computation by the switches, the states change their location each clock flank and so does the PSI definition! (Whether $\geq 8$ or $<8$!). That's why FIG. 14 shows both, the PSI($<8$) and the PSI($\geq 8$) version.

For the total system, it is generally applicable that control of the parallel data exchange is effected for equal access in the path memory from the ACSS network via the ACSS address processor interface by the hypothetical source data information itself, which is also utilized as data flow direction information.

Figure 15:
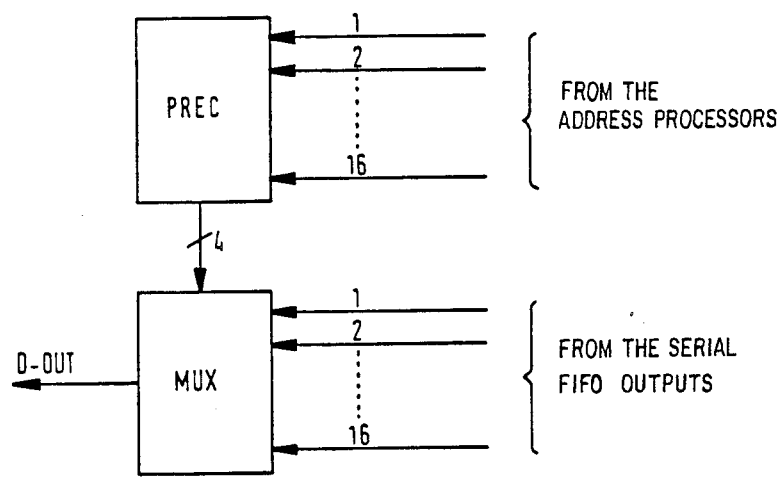
FIG. 15 is a diagram showing the structure of the data output units.

Data output units DA1 . . . DA16 can be combined very easily in a module, as shown in FIG. 15. This is done as follows: a priority encoder PREC composed as before of two integrated circuits 74F148 receives the 16 DOC (data output call) signals of the address processors downstream of the corresponding exchange switches. The priority encoder PREC which has as a 4-bit wide output is connected with a multi-plexer MUX which connects one of the 16 serial FIFO outputs with data output D-OUT of the decoder pursuant to the output signal of priority encoder PREC.

The priority encoder PREC and the multiplexer MUX are standard circuitry elements. The priority encoder transforms an active signal on one of its input lines 1 . . . 16 into a 4-bit-wide binary number at its outputs. If, e.g. the line No. "1" is active, a binary "0000"=0 is output. By this way, the DOC signals can be evaluated, i.e. an active DOC indicates, which path memory line has to be output-selected. This output select can easily be performed by a standard multiplexer chip directly connected with its channel address bits to these four output bits. E.g. the 'LS251 or the 'F251 are usable when cascaded. The functions are the same as those of the multiplexing switches of FIG. 13. The FIG. 15 circuit is nothing else than a substitution of the DA-1-16 elements in FIG. 13.

For more profound information about these standard elements, please refer to widely available data sheets, e.g. FAIRCHILD, FAST or FACT series, e.g. the F74F148 for PREC and F74F251 for MUX.

Figure 16:
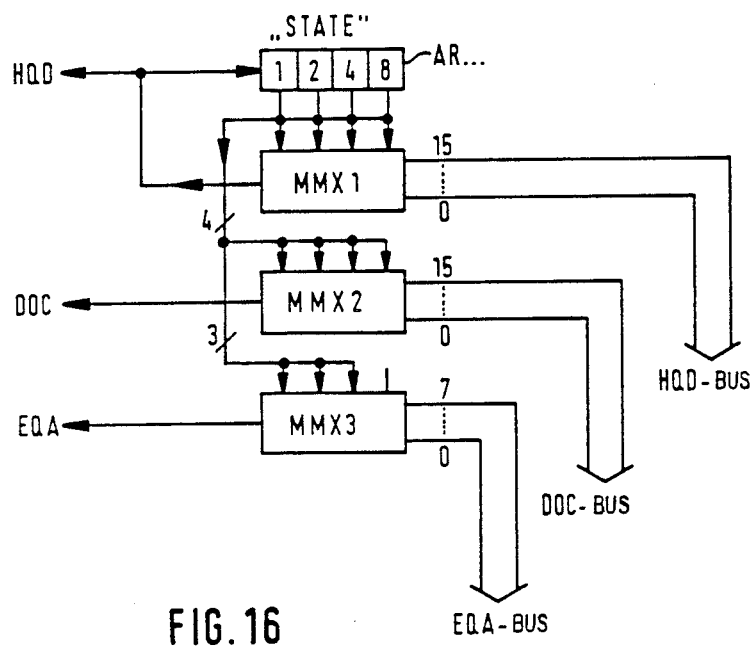
FIG. 16 is a diagram showing the address processors with multiplexers.

FIG. 16 shows the address processors with state registers as well as the associated exchange switches which are now realized as multiplexers MMX1 . . . MMX3. Each cell of the state register AR is connected, via a 4-bit line, with respective control inputs of the three multiplexers MMX1 . . . MMX3, with only the first three lines being connected to multiplexer MMX3. Multiplexer MMX1 is provided to switch through the hypothetical source data channels (HQD signals), multiplexer MMX2 is provided to address the DOC bus and multiplexer MMX3 is provided to address the EQA bus.

FIG. 16 shows, like FIG. 15, a composition of totally standard elements. So its function is easily described: The shift register, containing a binary number called "state", supplies with its four-bit-wide parallel output the address inputs of several multiplexers "MMX1-3". Consequently, one of the input bus bars 0 . . . 15 (0 . . . 7, MMX3) is switched through to the output depending on the standard function of a multiplexer like the F74F251 of the FAST series, cascaded, if necessary. The shift register is also standard-type, e.g. the F74F299 with parallel outputs (only four used here). The "MMX3" is only an 8-to-3 multiplexer, for there are only 8 EQA signals to distribute, like described above. Here, the MSB of the AR is not used. The whole circuit FIG. 16 is repeated 16 times in this decoder, supplying 16 path memory lines with information and control data. These stages perform the so-called "in-place-computation".

The description of the Viterbi decoding process is now complete. It intended to precisely define a process capable of high speed, with the selection of technology depending on the respective requirements. It has also been pointed out that VLSI integration is of advantage for reasons of space—and, because of the delays involved, also for reasons of speed.

Under these conditions, the method can be used in so-called "intelligent transponders" on board satellites.

The present disclosure relates to the subject matter disclosed in Federal Republic of Germany application No. P 36 00 905.9 of Jan. 15, 1986, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. In a method of decoding source data binary signals processed at an encoder according to an error correcting convolution code having a constraint length of K bits, including deriving branch metrics by means of binary operations, and determining, from the derived branch metrics, path metrics having respective values according to Viterbi decoding for the reception probability of the source data binary signals formed at the encoder, the improvement comprising the steps of:

transforming each path metric from the arithmetic to the logic range of operation;

linking the thus transformed path metric having an extreme value by means of logic gates with the remaining transformed path metrics in such a manner that the path metric having the extreme value is subtracted from every one of the remaining path metrics;

simulating, in real time, all possible binary signal states which can occur at the encoder, wherein each such binary signal state corresponds to a binary word having $K-1$ bits and each binary word value is capable of immediately succeeding only two different binary word values as represented by respective branches of a Viterbi decoding trellis;

deriving, from each possible binary signal state, data representing the value of the probable binary signal state which preceded the presently simulated state;

addressing respective hypothetical source data channels with the simulated states and feeding to those channels the derived data;

actualizing the simulated possible binary states from each hypothetical source data channel, and addressing, with the actualized states, a respective buffer memory for each channel;

overwriting each buffer memory whose content represents a less probable binary word value sequence with a content representing a more probable sequence;

outputting decoded binary signals from the buffer memories by addressing according to actualization of the possible binary signal states at the encoder; and addressing $2^{K-1}$ different output instruction channels for causing an output instruction to be performed by only that output instruction channel which is associated with the path metric having the extreme value.

2. A Viterbi decoder for decoding source data binary signals processed at an encoder according to an error correcting convolution code having a constraint length of K bits, the decoding being performed by deriving branch metrics by means of binary operations, and determining, from the derived branch metrics, path metrics having respective values for the reception probability of the source data binary signals formed at the encoder, said encoder comprising:

an input section for receiving transmitted code bit pairs derived fron the source data signals and for deriving therefrom the branch metrics, said input section comprising: two sample and hold members for receiving and temporarily storing received signals representing the bits of each pair; two analog/digital converters each connected to a respective sample and hold member for deriving a digital signal constituting a quantized version of the amplitude of the received signal stored in the respective connected sample and hold member; two multiplexers connected for effecting a reciprocal exchange of the digital signals at the outputs of said analog/digital converters, each multiplexer being connected to provide the digital signal from a respective converter; logic gate means connected to receive the digital signals provided by said multiplexers and a control signal, said logic gate means including four groups of binary gates, each group having a number of binary gates equal to the number of bit positions in the digital signal and having an input connected to receive a respective digital signal bit from a respective one of said multiplexers, said four groups of gates being composed of two first groups having non-inverting outputs and each connected to a respective one of said multiplexers and two second groups having inverting outputs and each connected to a respective one of said multiplexers; four full adders, each having inputs connected to the outputs of two of said groups of gates for providing digital output signals associated with the branch metrics;

a plurality of path metric calculating networks each connected for receiving selected digital output signals from said input section, for calculating therefrom path metric values and for deriving a path decision bit and an output instruction relating to a respective possible binary signal state at the encoder, the path decision bit being representative of the probable source data bit sequence resulting in the respective possible state, each said path metric calculating network comprising: a comparison stage for comparing opposite path metrics; a path decision bit detector connected to the output of said comparison stage; means including a subtraction stage and forming a return loop connected to the output of said comparison stage for linking the output signal of said comparison stage with a selected one of the branch metric signals supplied to said network; and a minimum metric detector connected to said return loop for generating the output instruction;

means defining a plural stage AND-linkage connected to receive a selected path metric from each said network;

priority encoder means connected between the output of said AND-linkage and said subtraction stage of each said network;

a plurality of address processors each having an associated address register;

a plurality of buffer memories;

a plurality of hypothetical source data channels each having a first transfer switch connected between said networks and a respective buffer memory, each said transfer switch being connected to be actuated by a respective address processor;

bidirectional data exchange means including second transfer switches connected to said buffer memories for permitting a selected buffer memory to be overwritten with the contents of a different buffer memory, said second transfer switches being connected to be controlled by said address processors;

interface circuit means connected between the outputs of selected pairs of networks and said address processors for recoding the path decision bits into data relating to information associated with hypothetical source data, the recoding being effected to indicate whether the information has a value no less than $2^{K-2}$ or less than $2^{K-2}$, said interface circuit means being operative to forcibly switch a respective bit of one parity to always have two different information contents available in parallel; data output means for controlling read-out from each said buffer memory; and a plurality of third transfer switches for connecting said minimum metric detectors to said data output means, said third transfer switches being connected to be controlled by said address processors.

3. A decoder as defined in claim 2 wherein each said network is constructed to be partially arithmetic and is connected to receive to digital output signals associated with mutually opposite branch metrics, and each said network further comprises: two adder stages each connected to receive a respective one of the digital output signals and each having an output connected to said comparison stage; a metric selector having inputs connected to the outputs of said adder stages and to the output of said comparison stage; and demultiplexing means connected to the output of said metric selector for transforming the signal at the output of said metric selector into a multi-bit word having a selected bit value at a position corresponding to the value of the signal at the output of said metric selector; wherein said demultiplexing means of all of said networks are connected to said plural stage AND-linkage.

4. In a Viterbi decoder for decoding source data binary signals processed at an encoder according to an error correcting convolution code having a constraint length of K bits, the decoding being performed by deriving branch metrics by means of binary operations performed on transmitted code bits derived from the source data binary signals, and determining, from the derived branch metrics, path metrics having respective values for the reception probability of the source data binary signals formed at the encoder, the decoder including a plurality of path metric calculating networks for calculating path metrics in response to the branch metrics, the improvement wherein: each said network is constructed to perform exclusively logic operations and comprises: first and second metric registers each storing a respective path metric in the form of a single bit of one binary value at a given location in series of bits of the opposite binary value; first and second shift matrices each having a length of $2^{K-1}$ bits and each connected to receive a path metric from a respective one of said metric registers and for shifting the received path metric forward by a number of bit positions equal to the value of a respective one of two opposite branch metrics; a logic linkage gate connected to said shift matrices for logically linking corresponding bits stored in said shift matrices, and a third shift matrix having a control input and connected to supply a path metric to said second shift register; and said decoder further comprises: a plural stage AND-linkage member connected to logically link corresponding bits appearing at said logic linkage gates of all of said networks; and a priority encoder connected between the output of said AND-linkage member and said control input of said third shift matrix of all of said networks for shifting the path metric in each said third shift matrix of each said network back by an amount corresponding to the value of the path metric received by said priority encoder.

* * * * *